US008149588B2

(12) United States Patent
Sip

(10) Patent No.: US 8,149,588 B2
(45) Date of Patent: Apr. 3, 2012

(54) CIRCULAR ELECTRONIC APPARATUS

(75) Inventor: Kim-Yeung Sip, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 288 days.

(21) Appl. No.: 12/577,737

(22) Filed: Oct. 13, 2009

(65) Prior Publication Data

US 2011/0063813 A1 Mar. 17, 2011

(30) Foreign Application Priority Data

Sep. 11, 2009 (CN) .......................... 2009 1 0306906

(51) Int. Cl.
*H05K 3/00* (2006.01)
(52) U.S. Cl. ........ 361/792; 361/735; 361/733; 361/730; 361/760; 361/724

(58) Field of Classification Search .................. 361/792, 361/733, 735, 730, 724, 760; 257/685, 720
See application file for complete search history.

(56) References Cited

U.S. PATENT DOCUMENTS

| 4,499,607 A * | 2/1985 | Higgins ........................ 398/164 |
| 4,937,659 A * | 6/1990 | Chall, Jr. ........................ 257/685 |
| 5,150,279 A * | 9/1992 | Collins et al. ............ 361/679.53 |
| 6,469,901 B1 * | 10/2002 | Costner ........................ 361/730 |

* cited by examiner

*Primary Examiner* — Tuan T Dinh
*Assistant Examiner* — Hung Dang
(74) *Attorney, Agent, or Firm* — Altis Law Group, Inc.

(57) ABSTRACT

The present invention provides a circular electronic apparatus. The circular electronic apparatus includes a circular crust and a plurality of isosceles trapezoid circuit boards. The isosceles trapezoid circuit boards are put together to form an equilateral polygon. Each isosceles trapezoid circuit board is connected with an adjacent isosceles trapezoid circuit board by a plurality of electrical lines and all the isosceles trapezoid circuit boards are connected together. The circular crust covers the equilateral polygon circuit board.

6 Claims, 4 Drawing Sheets

CIRCULAR ELECTRONIC APPARATUS

BACKGROUND

1. Technical Field

The disclosure relates to electronic apparatuses and, more particularly, to a circular electronic apparatus.

2. Description of the Related Art

Many circular electronic apparatuses often include a circular circuit board, such as a circular mobile phone, a circular lamp, and so on. The circuit board is very expensive. As shown in FIG. 1, a circuit board 1 is often cut into a plurality of circular circuit boards 11 for the circular electronic apparatuses. Each circular circuit board is tangent with the adjacent circular circuit board. Therefore, the remaining circuit boards 12 of the big circuit board 1 are very irregular and hard to utilize.

BRIEF DESCRIPTION OF THE DRAWINGS

The components in the drawings are not necessarily drawn to scale, the emphasis instead being placed upon clearly illustrating the principles of the circular electronic apparatus. Moreover, in the drawings, like reference numerals designate corresponding parts throughout the several views.

DETAILED DESCRIPTION

Figure 2:
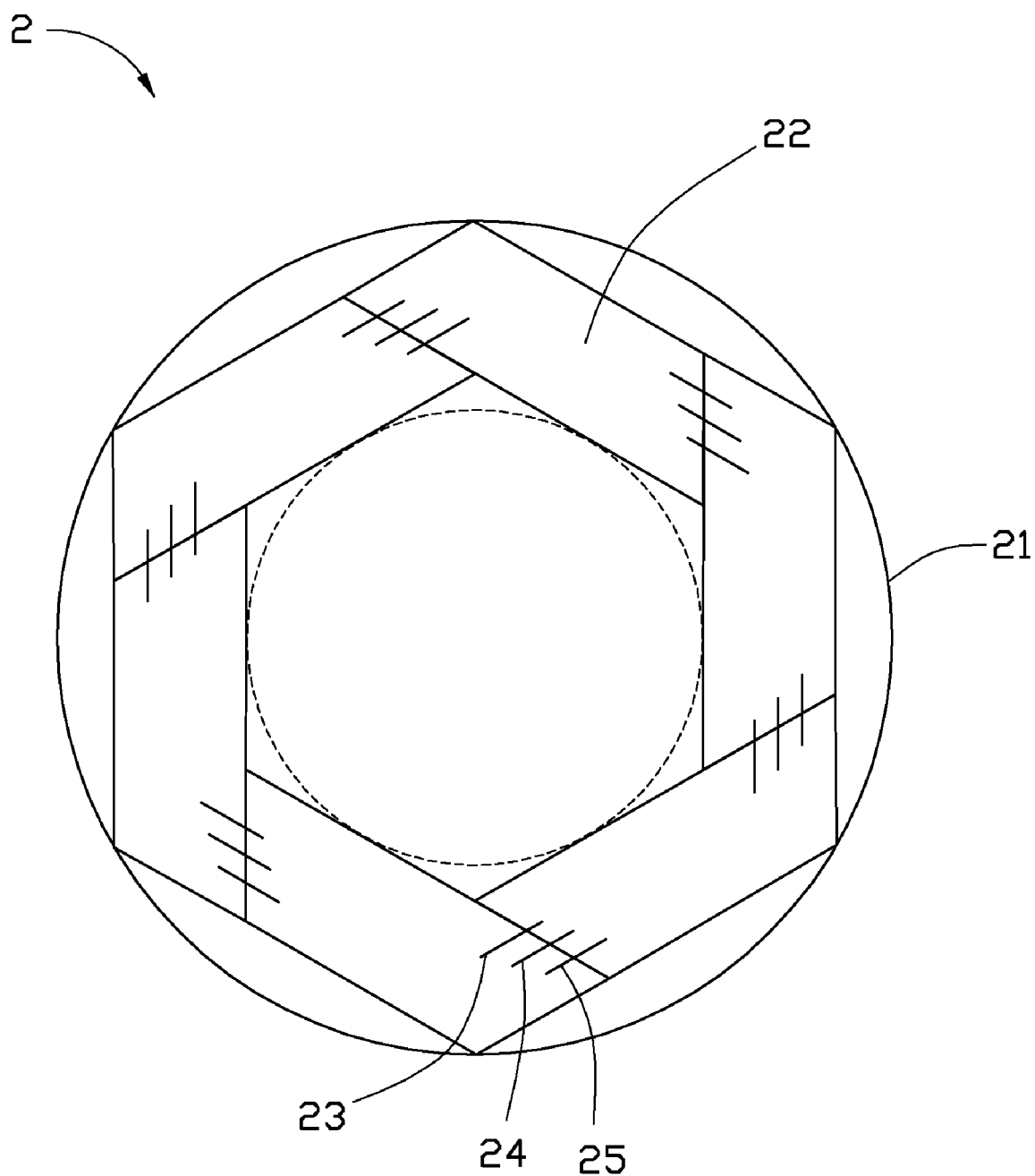
FIG. 2 is a first layout view of isosceles trapezoid circuit boards of a circular electronic apparatus in accordance with an embodiment.

A circular electronic apparatus, such as a circular lamp, a circular media player, and a circular mobile phone, can be made to include a circular crust and a plurality of isosceles trapezoid circuit boards. FIG. 2 is a first layout view of isosceles trapezoid circuit boards of the circular electronic apparatus in accordance with an embodiment. In this embodiment, the circular electronic apparatus 2 includes a circular crust 21 and six isosceles trapezoid circuit boards 22. The six isosceles trapezoid circuit boards 22 are in the same size and shape, and are put together to form an equilateral hexagon. The circular crust 21 covers the equilateral hexagon circuit board.

Each isosceles trapezoid circuit board 22 is connected with an adjacent isosceles trapezoid circuit board 22 by a plurality of electrical lines, thus, all the isosceles trapezoid circuit boards 22 are connected together. The plurality of electrical lines include a power source line 23, a control line 24, and a ground line 25, and are configured to establish a communication link among the isosceles trapezoid circuit boards 22. In this embodiment, a sloping side of each isosceles trapezoid circuit board 22 is superposed with a part of a long parallel side of the adjacent isosceles trapezoid circuit board 22. The three electrical lines 23, 24, and 25 are laid on the superposed portion.

Figure 3:
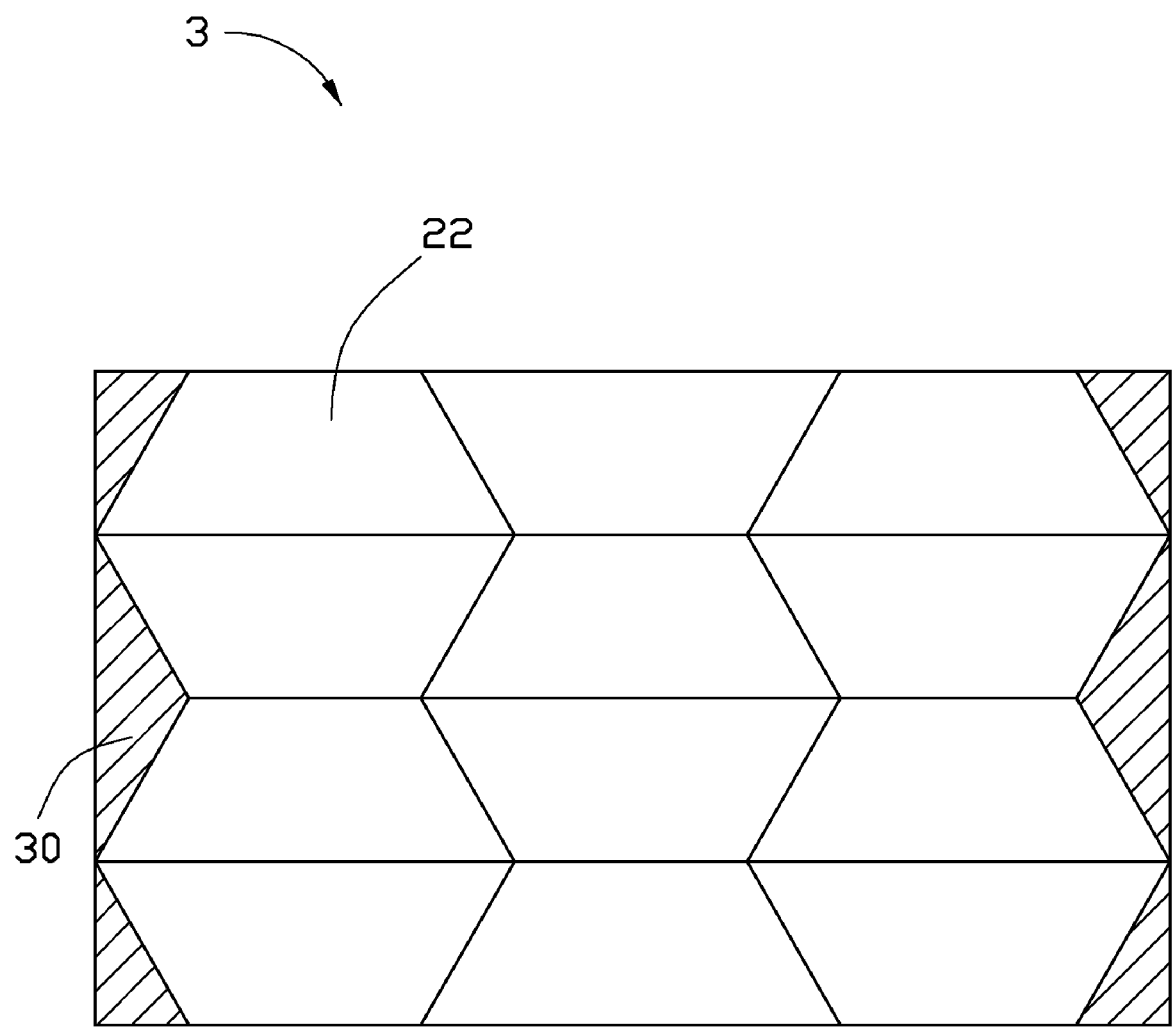
FIG. 3 is a schematic view showing a circuit board is cut into a plurality of isosceles trapezoid circuit boards in accordance with an embodiment.

FIG. 3 is a schematic view showing a circuit board is cut into a plurality of isosceles trapezoid circuit boards in accordance with an embodiment. The circuit board 3 is cut into a plurality of isosceles trapezoid circuit boards 22 for the circular electronic apparatus 2. In this embodiment, all the isosceles trapezoid circuit boards 22 are in the same size and shape. Therefore, the remaining circuit boards 30 of the circuit board 3 are smaller than the remaining circuit boards 12 of FIG. 1, and thus, it is apparent that the incision manner of FIG. 3 makes better use of the circuit boards than that of FIG. 1.

Figure 4:
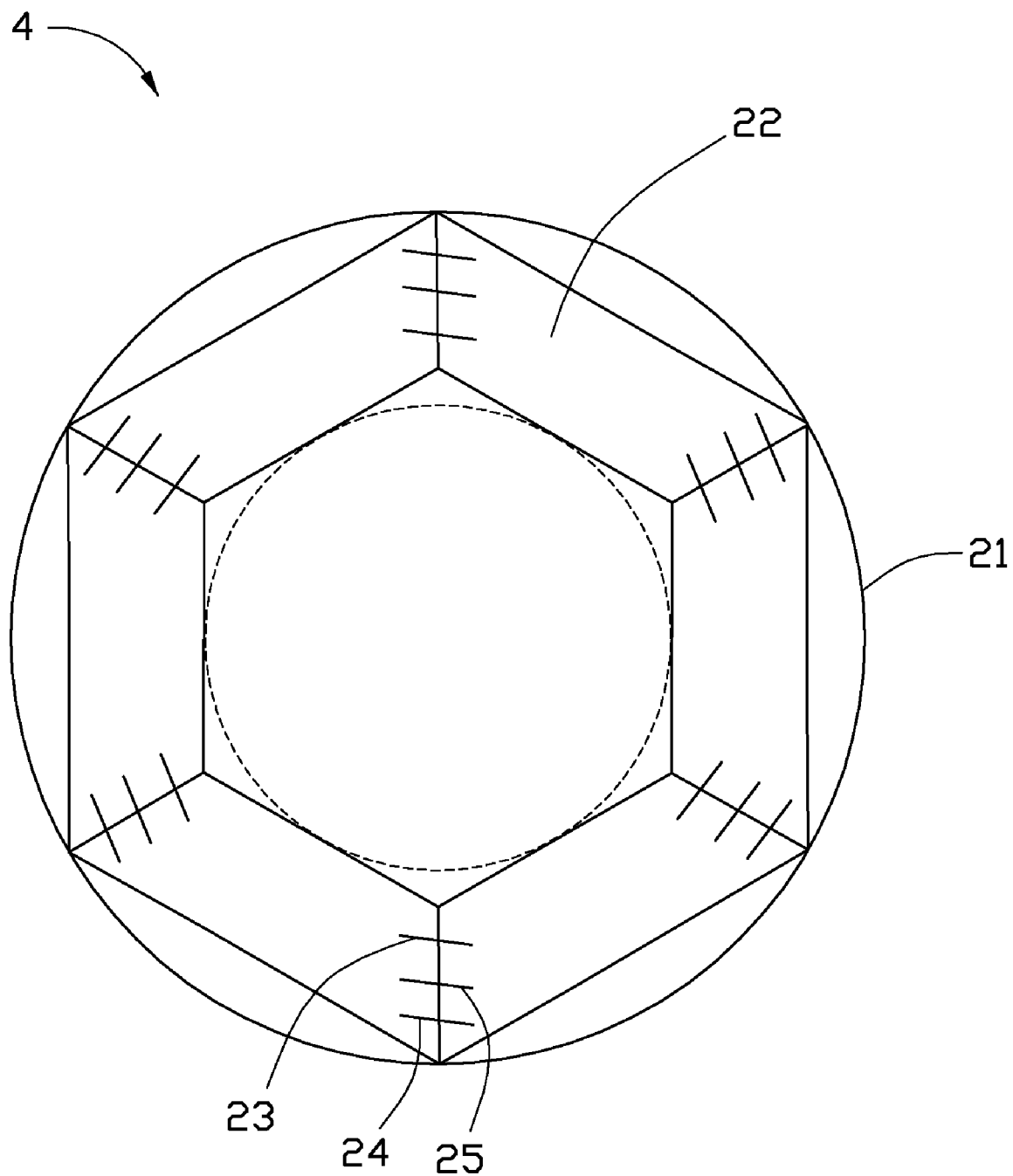
FIG. 4 is a second layout view of isosceles trapezoid circuit boards of a circular electronic apparatus in accordance with another embodiment.

FIG. 4 is a second layout view of isosceles trapezoid circuit boards of a circular electronic apparatus in accordance with another embodiment. The circular electronic apparatus 4 also includes the circular crust 21 and the six isosceles trapezoid circuit boards 22. All the isosceles trapezoid circuit boards 22 are in the same size and shape. In this embodiment, a sloping side of each of the isosceles trapezoid circuit boards 22 is superposed with a sloping side of the adjacent isosceles trapezoid circuit board 22, that is, there is a superposed side between the isosceles trapezoid circuit board 22 and the adjacent isosceles trapezoid circuit board 22. The isosceles trapezoid circuit board 22 is also connected with the adjacent isosceles trapezoid circuit board 22 by three electrical lines. The three electrical lines include the power source line 23, the control line 24, and the ground line 55, which are laid on the superposed side.

Figure 1:
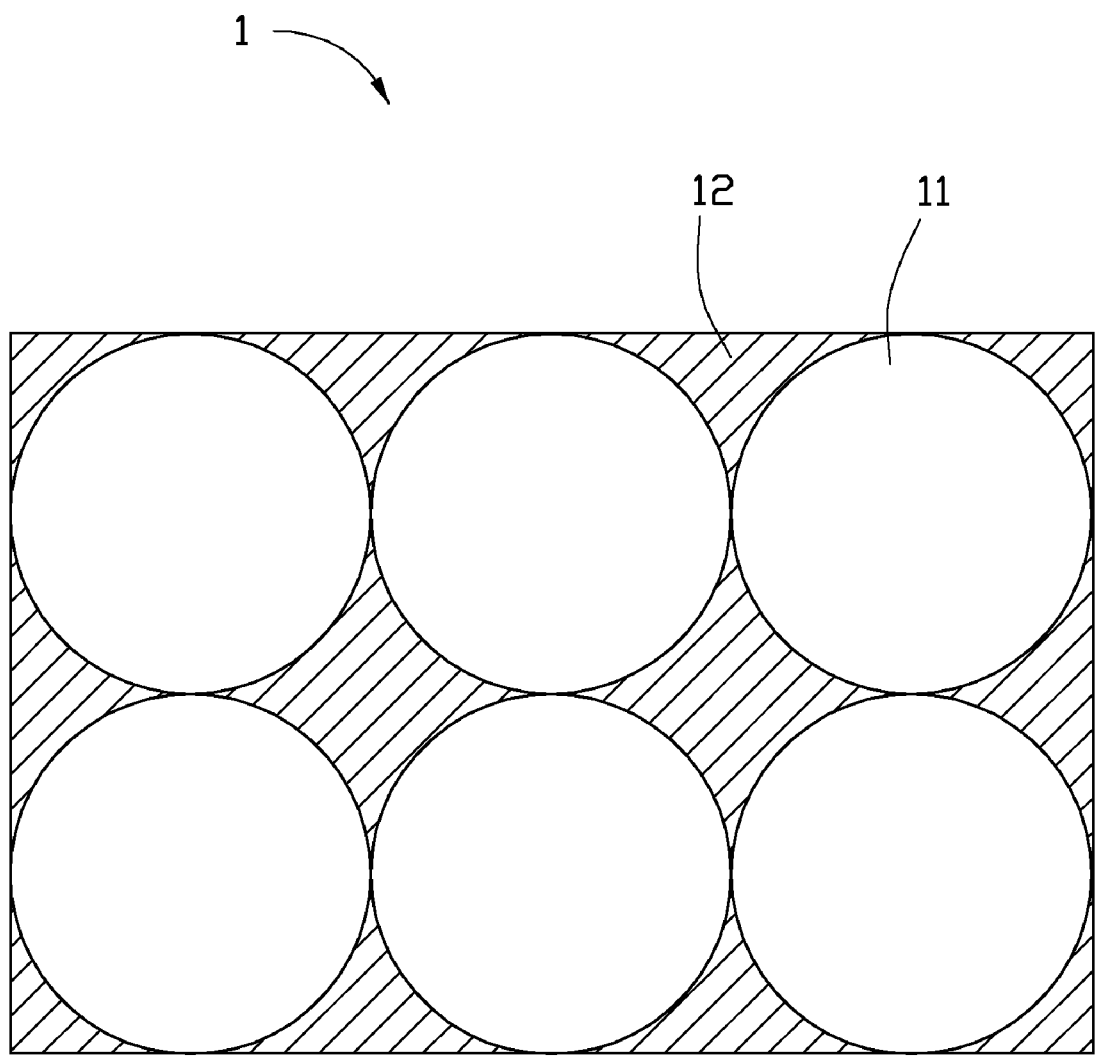
FIG. 1 is a schematic view of the related art showing a circuit board is cut into a plurality of circular circuit boards.

Therefore, the incision manner of cutting the circuit board into isosceles trapezoid makes better use of material than does that of cutting the circuit board into round, and an equilateral polygon circuit board being composed of six isosceles trapezoids cut in the incision manner of FIG. 3 saves cost than does a circular circuit board cut in the incision manner of FIG. 1 for a circular electronic apparatus.

In other embodiments, a plurality of isosceles trapezoid circuit boards 22 are put together to form equilateral polygon of different shapes. For example, four isosceles trapezoid circuit boards are put together to form a square, and five isosceles trapezoid circuit boards are put together to form an equilateral pentagon.

It is understood that the disclosure may be embodied in other forms without departing from the spirit thereof. Thus, the present examples and embodiments are to be considered in all respects as illustrative and not restrictive, and the disclosure is not to be limited to the details given herein.

What is claimed is:

1. A circular electronic apparatus comprising:
   a circular crust; and
   a plurality of isosceles trapezoid circuit boards;
   wherein the isosceles trapezoid circuit boards are put together to form an equilateral polygon, each isosceles trapezoid circuit board is connected with an adjacent isosceles trapezoid circuit board by a plurality of electrical lines, all the isosceles trapezoid circuit boards are in the same size and shape and connected together to form an equilateral polygonal circuit board with an equilateral polygonal hollow center, and the circular crust covers the equilateral polygonal circuit board.

2. The circular electronic apparatus as recited in claim 1, wherein the plurality of electrical lines comprise a power source line, a ground line, and a control line.

3. The circular electronic apparatus as recited in claim 1, one side of each isosceles trapezoid circuit board is adhered to one side or a part of one side of the adjacent isosceles trapezoid circuit board and the plurality of electrical lines are laid on a superposed side.

4. The circular electronic apparatus as recited in claim 3, wherein the number of the plurality of isosceles trapezoid circuit boards is six, and the six isosceles trapezoid circuit boards are put together to form the equilateral hexagon circuit board with an equilateral polygonal hollow center.

5. The circular electronic apparatus as recited in claim 4, wherein a sloping side of each isosceles trapezoid circuit board is superposed with one part of a long parallel side of the adjacent isosceles trapezoid circuit board.

6. The circular electronic apparatus as recited in claim 4, wherein a sloping side of each isosceles trapezoid circuit board is superposed with a sloping side of the adjacent isosceles trapezoid circuit board.

* * * * *